(12) United States Patent
Wago et al.

(10) Patent No.: US 7,294,294 B1
(45) Date of Patent: Nov. 13, 2007

(54) SURFACE MODIFIED STAMPER FOR IMPRINT LITHOGRAPHY

(75) Inventors: Koichi Wago, Sunnyvale, CA (US); Gennady Gauzner, Livermore, CA (US)

(73) Assignee: Seagate Technology LLC, Scotts Valley, CA (US)

(*) Notice: Subject to any disclaimer, the term of this patent is extended or adjusted under 35 U.S.C. 154(b) by 650 days.

(21) Appl. No.: 09/972,159

(22) Filed: Oct. 9, 2001

Related U.S. Application Data

(60) Provisional application No. 60/241,286, filed on Oct. 17, 2000.

(51) Int. Cl.
*B29C 33/60* (2006.01)

(52) U.S. Cl. .............. 264/2.5; 264/1.33; 264/130; 264/134; 264/338; 264/220; 425/93; 425/107; 425/403; 425/810

(58) Field of Classification Search .............. 264/1.33, 264/1.34, 1.7, 2.3, 2.5, 83, 338, 130, 132, 264/134, 220, 561; 430/320, 321; 427/135, 427/248.1; 425/403, 424, 810, 90, 93, 105, 425/107
See application file for complete search history.

(56) References Cited

U.S. PATENT DOCUMENTS

| | | | |
|---|---|---|---|
| 3,565,978 A | 2/1971 | Folger et al. ............... 264/1.34 |
| 3,842,194 A | 10/1974 | Clemens .................... 369/126 |
| 4,188,240 A * | 2/1980 | Yoshio ........................ 264/107 |
| 4,252,848 A | 2/1981 | Datta et al. .................. 427/490 |
| 4,482,511 A | 11/1984 | Komatsubara .............. 264/1.33 |
| 4,731,155 A | 3/1988 | Napoli et al. ................. 216/44 |
| 4,938,995 A | 7/1990 | Giordano et al. ............. 427/41 |
| 5,112,025 A | 5/1992 | Nakayama et al. ......... 249/115 |
| 5,330,880 A | 7/1994 | Horigome et al. ........... 264/1.4 |
| 5,503,963 A * | 4/1996 | Bifano ........................ 430/321 |
| 5,663,127 A | 9/1997 | Flynn et al. ................. 508/250 |
| 5,772,905 A | 6/1998 | Chou .......................... 216/44 |
| 5,817,242 A | 10/1998 | Biebuyck et al. ............. 216/41 |
| 5,853,506 A * | 12/1998 | Meldrum .................... 427/435 |
| 5,958,651 A * | 9/1999 | van Hoof et al. ........... 430/292 |

(Continued)

FOREIGN PATENT DOCUMENTS

JP 03-039239 * 2/1991

(Continued)

OTHER PUBLICATIONS

H. Schulz, F. Osenberg, J. Engemann, and H.C. Scheer, "Mask Fabrication By Nanoimprint Lithography Using Anti-Sticking Layers," Proc. SPIE vol. 3396, pp. 244-249, 16th European Conference On Mask Technology For Integrated Circuits And Microcomponents, Uwe F. Behringer, Ed., Feb. 2000.

(Continued)

*Primary Examiner*—Tim Heitbrink
*Assistant Examiner*—Thu Khanh T. Nguyen
(74) *Attorney, Agent, or Firm*—McDermott Will & Emery LLP

(57) ABSTRACT

A method of performing imprint lithography of a surface substrate includes a stamper having a thin lubricant coating thereon to facilitate release of the stamper from the imprinted surface to reduce degradation of image replication. Embodiments of the invention include stampers suitable for use in patterning servo information on magnetic recording media having a lubricant coating of from about 1 nm to about 20 nm.

5 Claims, 3 Drawing Sheets

U.S. PATENT DOCUMENTS

| | | | |
|---|---|---|---|
| 6,027,595 A | 2/2000 | Suleski | 156/230 |
| 6,049,656 A * | 4/2000 | Kim et al. | 392/419 |
| 6,117,284 A | 9/2000 | Mueller | 204/192.27 |
| 6,127,017 A | 10/2000 | Hirata et al. | 428/64.1 |
| 6,165,911 A | 12/2000 | Calveley | 438/754 |
| 6,168,845 B1 | 1/2001 | Fontana, Jr. et al. | 428/65.5 |
| 6,190,838 B1 | 2/2001 | Kerfeld | 264/1.33 |
| 6,190,929 B1 | 2/2001 | Wang et al. | 438/20 |
| 6,197,399 B1 * | 3/2001 | Naito et al. | 430/322 |
| 6,228,294 B1 | 5/2001 | Lee et al. | 264/39 |
| 6,242,831 B1 * | 6/2001 | Khan | 310/90 |
| 6,403,149 B1 * | 6/2002 | Parent et al. | 427/130 |
| 6,517,995 B1 * | 2/2003 | Jacobson et al. | 264/1.36 |
| 6,653,057 B1 * | 11/2003 | Koyama | 430/320 |

FOREIGN PATENT DOCUMENTS

| | | | |
|---|---|---|---|
| JP | 08-240654 | * | 9/1996 |

OTHER PUBLICATIONS

P. Gröning, A. Schneuwly, L. Schlapbach, and M.T. Gale, "'Self-Thickness-Limited' Plasma Ploymerization Of An Ultrathin Antiadhesive Film", J. Vac. Sci. Technol. A 14(6), Nov./Dec. 1996, pp. 3043-3048.

* cited by examiner

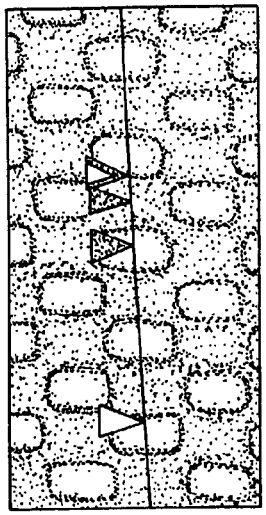
FIG. 3A
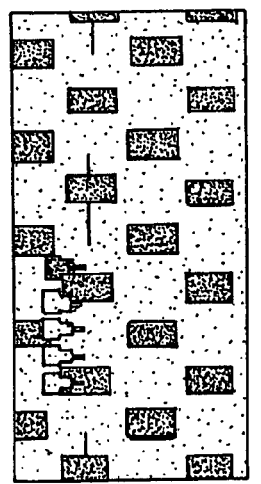
FIG. 3B
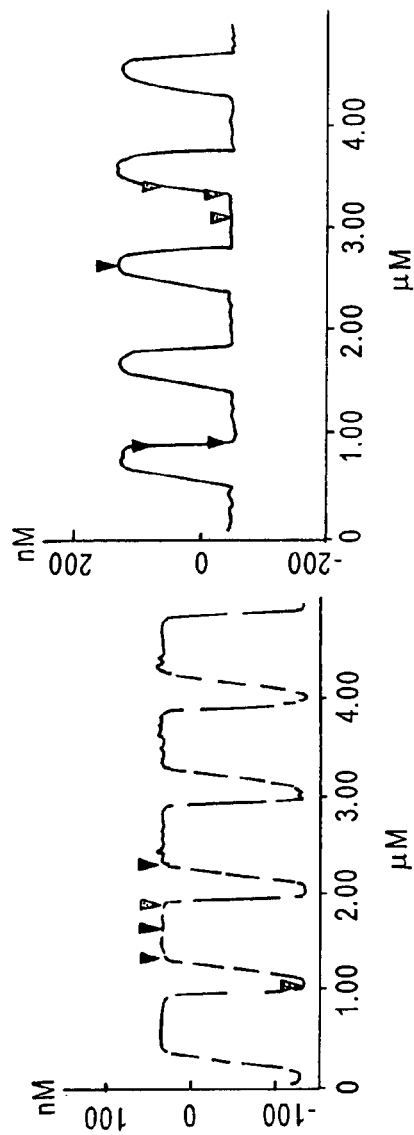

SURFACE MODIFIED STAMPER FOR IMPRINT LITHOGRAPHY

CROSS-REFERENCE TO PROVISIONAL APPLICATIONS

This application claims priority from U.S. provisional patent application Ser. No. 60/241,286, filed Oct. 17, 2000, the entire disclosure of which is incorporated herein by reference. This application contains subject matter similar to that disclosed in co-pending U.S. patent application Ser. No. 09/946,939, filed on Sep. 6, 2001.

FIELD OF THE INVENTION

The present invention relates to a stamper for forming sub-micron sized features and patterns in large area substrate surfaces by means of imprint lithography. The invention has particular utility in the formation of servo patterns in the surfaces of substrates used in the manufacture of information storage and retrieval media, e.g., hard disk magnetic recording media.

BACKGROUND OF THE INVENTION

Thermal imprint lithography has been recently studied and developed as a low cost alternative technique for patterning features in the surface of a substrate or workpiece, as for example, described in U.S. Pat. Nos. 4,731,155; 5,772,905; 5,817,242; 6,117,344; 6,165,911; 6,168,845 B1; 6,190,929 B1; and 6,228,294 B1. A typical thermal imprint lithographic process for forming nano-dimensioned features in a substrate surface is illustrated with reference to the schematic, cross-sectional views of FIGS. 1(A)-1(D).

Referring to FIG. 1(A), shown therein is a mold 10 including a main (or support) body 12 having upper and lower opposed surfaces, with a molding layer 14 formed on the lower opposed surface. As illustrated, molding layer 14 includes a plurality of features 16 having a desired shape or surface contour. A substrate 18 carrying a thin film layer 20 on an upper surface thereof is positioned below, and in facing relation to the molding layer 14. Thin film layer 20, e.g., a thin film of polymethylmethacrylate (PMMA), can be formed on the substrate/workpiece surface by any appropriate technique, e.g., by a spin coating technique.

FIG. 1(B), is illustrative of a compressive molding step, where mold 10 is pressed into the thin film layer 20 in the direction shown by arrow 22, so as to form depressed, i.e., compressed, regions 24. In the illustration, features 16 of the molding layer 14 are not pressed all of the way into the thin film layer 20 and thus do not contact the surface of the underlying substrate 18. However, the top surface portions 24a of thin film 20 can contact depressed surface portions 16a of molding layer 14. As a consequence, the top surface portions 24a substantially conform to the shape of the depressed surface portions 16a, as for example, a flat surface. When contact between the depressed surface portions 16a of molding layer 14 and thin film layer 20 occurs, further movement of the molding layer 14 into the thin film layer 20 stops, due to the increase in contact area, leading to a decrease in compressive pressure when the compressive force is constant.

FIG. 1(C) shows the cross-sectional surface contour of the thin film layer 20 following removal of mold 10. The molded, or imprinted, thin film layer 20 includes a plurality of recesses formed at compressed regions 24 which generally conform to the shape or surface contour of features 16 of the molding layer 14. Referring to FIG. 1(D), in a next step, the surface-molded workpiece is subjected to processing to remove the compressed portions 24 of thin film 20 to selectively expose portions 28 of the underlying substrate 18 separated by raised features 26. Selective removal of the compressed portions 24 may be accomplished by any appropriate process, e.g., by reactive ion etching (RIE) or wet chemical etching.

The above-described imprint lithographic processing is capable of providing sub-micron-dimensioned features, as by employing a mold 10 provided with features 16 comprising pillars, holes, trenches, etc., patterned by means of e-beam lithography, RIE, or other appropriate patterning method. Typical depths of features 16 range from about 5 to about 200 nm, depending upon the desired lateral dimension. The material of the molding layer 14 is typically selected to be hard relative to the thin film layer 20, the latter typically comprising a thermoplastic material which is softened when heated. Suitable materials for use as the molding layer 14 include metals, dielectrics, semiconductors, ceramics, and composite materials. Suitable materials for use as thin film layer 20 include thermoplastic polymers which can be heated to above their glass temperature, $T_g$, such that the material exhibits low viscosity and enhanced flow.

Nanoimprint lithographic techniques effect the possibility of a low-cost, mass manufacturing technology for fabrication of sub-100 nm structures, features, etc. The problems, however, associated with this technique include, for example, non-uniform replication and sticking of the thermoplastic polymer materials to the molding layer 14. The uniformity and sticking difficulties tend to be more pronounced when the mold or stamper is applied to a large-area substrate, e.g., as in the formation of servo patterns in 95 mm diameter disks used in hard disk drives and is increasingly problematic as the feature size is reduced. Poor mold release, i.e. sticking, causes peeling or otherwise damage to the imprinted layer resulting in the degradation of dimensional integrity of the imprinted pattern or feature.

Stampers have been employed in various recording arts. For example, U.S. Pat. No. 4,252,848 to Datta et al. discloses methods of applying perfluorinated polymer films to a substrate. In Example 7, Datta et al. disclose a coated metal stamper for the production of vinyl polymer disks, i.e. conventional record albums for recording music. U.S. Pat. No. 4,482,511 to Komatsubara describes a method for manufacturing a stamper including depositing a low surface energy film on a stamp-forming-master. A stamper is then made from the master. U.S. Pat. No. 5,330,880 to Horigome et al. relates to a process for producing optical disks including treating the surface with a releasing agent to facilitate the process.

In view of the above, there exists a need for improved methodology and means for performing imprint lithography which eliminate, or at least substantially reduce, the disadvantageous degradation of imprint quality associated with the use of a stamper for sub-micron lithography. More specifically, there exists a need for an improved means and methodology for sub-micron imprinting of a pattern, e.g., a servo pattern, in a surface of a resist or other type relatively soft material on the surface of a substrate for information storage and retrieval medium, e.g., a hard disk magnetic recording medium.

DISCLOSURE OF THE INVENTION

An advantage of the present invention is a stamper suitable for imprint lithography of a substrate surface, where the surface of the stamper has been modified to enhance its releasing properties.

Another advantage of the present invention is a method of fabricating a coated stamper suitable for imprint lithography.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a stamper suitable for thermal imprint lithography. The stamper comprises an imprinting surface having at least one sub-micron feature and a thin lubricant coating on the imprint surface having the feature. The inventive stamper of the present invention advantageously has a lubricant coating that has a thickness less than the smallest dimensioned feature on the imprinting surface, e.g. less than about 100 nm.

In accordance with embodiments of the present invention, the stamper comprises a main body and an imprinting surface having a negative image, e.g. a plurality of features, representing a pattern to be formed in a workpiece's surface. The main body and the imprinting surface of the stamper can be composed of the same material, or the main body and the imprinting surface of the stamper can be composed of different materials. The features can be protruding or recessed on the imprinting surface and have a dimension of about 10 to about 200 nm. Advantageously, the lubricant provided on the imprinting surface of the stamper has at thickness that is less than the dimensions of the features, e.g. having a thickness of about 1 nm to about 100 nm. The lubricant coating on the imprinting surface thereby minimizes, if not completely eliminates, peeling of the imprinted layer and provides replication with high precision and high repeatability characteristics.

In accordance with further embodiments of the present invention, the workpiece surface is comprised of a layer of a material different from the substrate material, e.g., the workpiece surface comprises a resist layer, e.g., a thermoplastic polymer material, and the substrate is comprised of a material selected from the group consisting of glass, ceramics, glass-ceramics composites, metals, and metal alloys. The stamper includes a main body and an imprinting surface having a negative image to be formed in the surface of the resist layer.

Another aspect of the present invention is a method of fabricating a coated stamper suitable for thermal imprint lithography. The method comprises providing a stamper suitable for thermal lithography having an imprinting surface; applying a lubricant coating on the imprinting surface of the stamper having a thickness of no more than about the smallest feature height or dimension on the stamper. The method of the present invention advantageously provides a lubricant coating on the imprinting surface of the stamper having a thickness of from about 1 nm to about 100 nm.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the features are not necessarily drawn to scale but rather are drawn as to best illustrate the pertinent features, wherein:

FIGS. 3(A), 3(A)(1), 3(B) and 3(B)(1) show Atomic Force Microscopy (AFM) images and cross-sectional profiles of a lubricant treated stamper and an imprinted PMMA layer, respectively.

DESCRIPTION OF THE INVENTION

The present invention addresses and solves problems and difficulties such as degradation of replication quality due to resist deformation, peeling, and poor release, attendant upon the use of thermal imprint lithography for pattern definition in a workpiece surface. The present invention is particularly applicable to the fabrication of hard disk substrates with integrally formed servo patterns having sub-micron features, while maintaining automated manufacturing technology for pattern formation by imprint lithography. Further, the methodology and means afforded by the present invention enjoy diverse utility in the imprint lithographic patterning of a variety of substrates and workpieces.

The present invention addresses and solves problems attendant upon the use of a stamper and substrates in performing imprint lithography, e.g., nanoimprint lithography for forming submicron-dimensioned patterns and features in substrate surfaces used in magnetic recording media manufacture. The invention is based upon the discovery that degradation of pattern replication arising from resist damage, loss of dimensional accuracy, peeling, sticking, etc., can be eliminated, or at least minimized by the use of a thin lubricating coating on the imprinting surface of the stamper. Unlike prior art uses of lubricating coatings, the present invention recognizes the desirability of maintaining a thin lubricant thickness on a stamper for sub-micron lithography. The stamper of the present invention facilitates accurate, high quality replication of a desired pattern in an imprintable layer, e.g., of a thermoplastic resist, on a substrate surface.

Figure 1A:
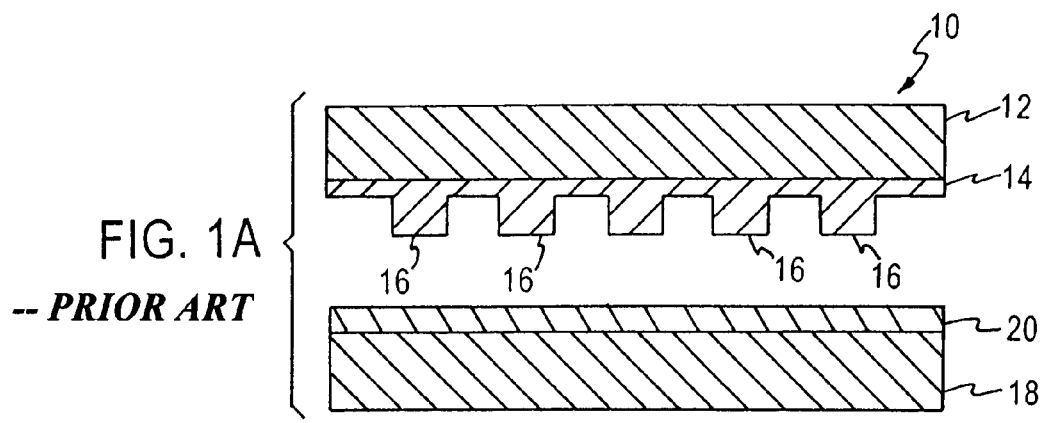
FIGS. 1(A)-1(D) are schematic, simplified cross-sectional views illustrating a process sequence for performing thermal imprint lithography of a thin resist film on a substrate (workpiece) according to the conventional art.
Figure 1B:
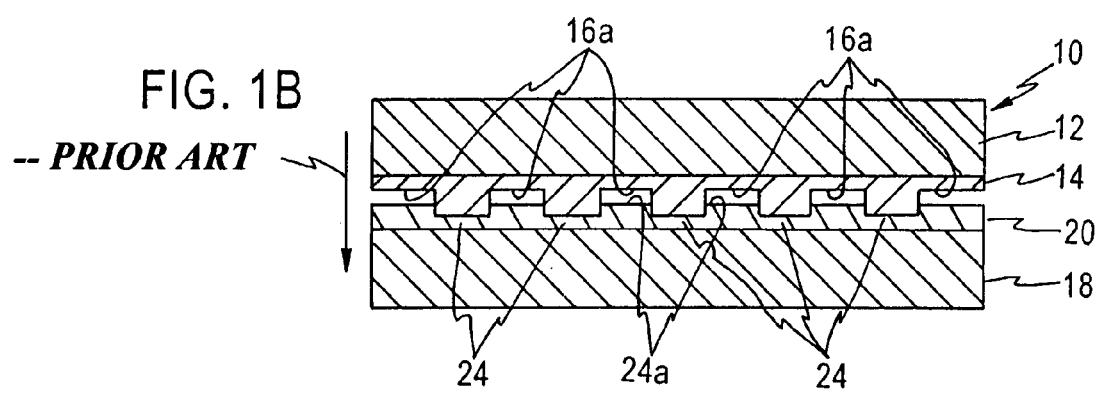
Figure 1C:
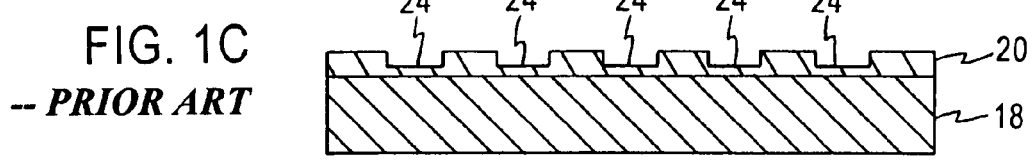
Figure 1D:
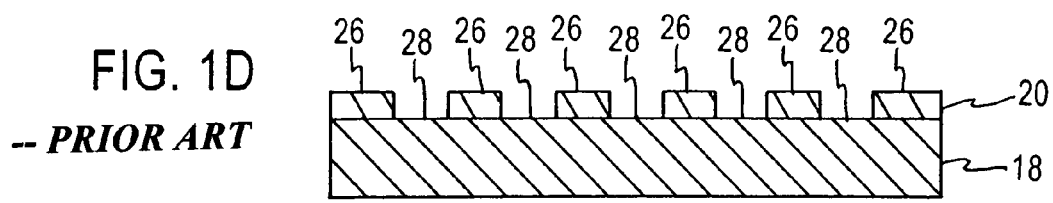
Figure 2:
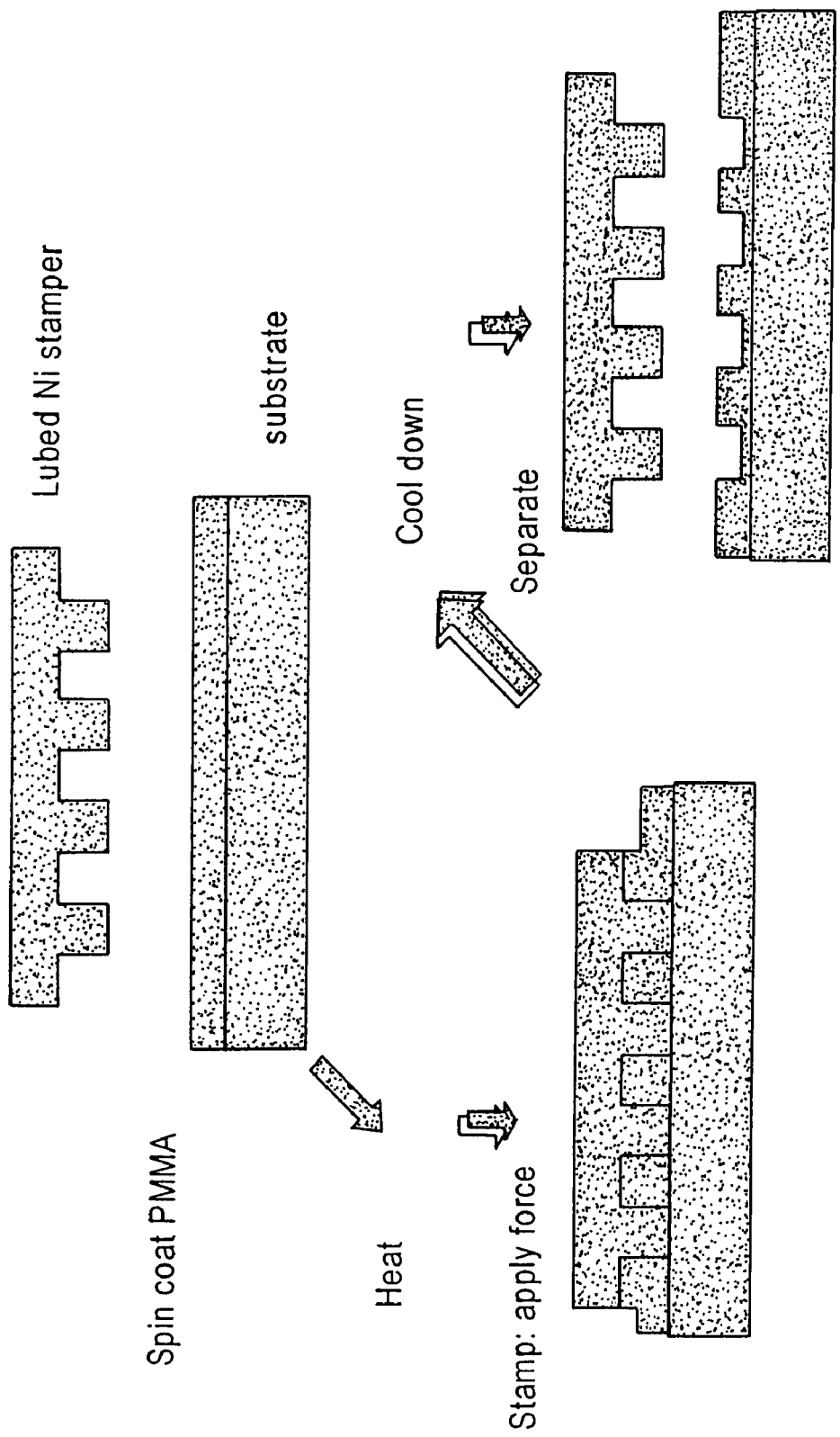
FIG. 2 schematically illustrates, in simplified cross-sectional view, a sequence of steps for performing imprint lithography of a resist film according to an embodiment of the present invention.

Referring now to FIG. 2, schematically illustrated therein, in simplified cross-sectional view, is a sequence of processing steps for performing nano-imprint lithography of a substrate utilizing a stamper. Thermal imprint lithography stampers have been labeled by various terms, such as molds, stampers, imprinters, masks, etc. All of which are encompassed by the present inventive article of manufacture. This stamper can be fabricated as by conventional electro-forming nickel or copper onto a master plate comprising a pattern photoresist or by etching through a substrate, e.g., of silicon, coated with a layer of pattern photoresist. Feature sizes as small as 20 nm can be formed by E-beam lithography. In one aspect of the present invention, the features on the imprinting surface of the stamper vary from about 1 nm to about 200 nm.

In practicing nano-imprint lithography in one aspect of the present invention, a thin film of a thermoplastic polymer, such as polymethylmethacrylate (PMMA), was spin-coated on a 95 mm diameter disk-shaped substrate. Suitable substrate useful for the present inventive methods typically comprises materials for magnetic hard disk media, e.g., glass, ceramic, glass-ceramic composites, metal based alloys, such as aluminum (Al)-based materials such as nickel phosphorous-coated Al. Thereafter, the substrate and stamper were heated to above the glass transition temperature ($T_g$) of the PMMA, i.e., above about 105° C., and the negative image of the imprinting surface of the stamper was embossed into the surface of the thermoplastic PMMA layer at a pressure sufficient to form the desired patterns, e.g. at a pressure of about 6.9 MPa. The stamper was then maintained in contact with the PMMA layer and under pressure until the desired patterns are formed, and then removed from the substrate to leave replicated features of the imprinting surface in the surface of the PMMA layer.

The present invention provides improved stampers and methodology useful in practicing the above-described replication imprinting method. Specifically, according to the present invention, a thin lubrication layer is provided on the imprinting surface of the stamper.

Stampers suitable for the present invention can be fabricated by conventional electro-forming techniques, such as electro-forming a Ni-based stamper from a master mold. In this manner, the imprinting surface of the stamper can be formed having dimensions suitable for nano-imprint lithography. The imprinting surface is then treated or modified to enhance the release properties thereof. For example, a lubricant layer of about 1 nm to about 100 nm, e.g. about 1 nm to about 20 nm, can be applied directly on the imprinting surface of the stamper.

The drive towards ever increasing recording density and faster data transfer rates and the resulting smoother disk surfaces and lower flying heights, has served as an impetus for the development of methods and tools for fabricating imprinted features into a magnetic recording medium at smaller dimensions. In accordance with the present inventive stamper suitable for thermal imprint lithography, a thin lubricating coating is applied directly to the imprinting surface of the stamper. To obtain the full benefits of the present invention, the thickness of the lubricant coating on the imprinting surface of the stamper should be less than the smallest dimensioned feature on the imprinting surface.

It is further recognized that the lubricant must perform a variety of different purposes requiring diverse characteristics and attributes. For example, the lubricant is preferably chemically inert, possesses a low vapor pressure, low surface tension, high thermal stability, etc. Moreover, it is preferred that the lubricant tightly adheres to the imprinting surface over the lifetime of several imprinted replications.

Several classes of lubricants can satisfy many of the desired properties. Amongst the many lubricants available, perfluoropolyethers (PFPE) can be used. In an embodiment of the present invention, a stamper with a lubricant film of less than about 10 nm, e.g. about 20 Å (2 nm), of Z-tetroal is applied directly to the imprinting surface of the stamper.

The lubricant coating of the present invention can be applied to the imprinting surface of the stamper by a dip coating process where the stamper is dipped and removed from a solution containing the lubricant. In an embodiment of the present invention, the lubricant is dissolved in a conventional hydrofluorocarbon solvent, perfluorocarbon solvent, hydrofluoroether solvent or mixtures thereof such as PF-5060 (3M Corp.), HFE 7100 (3M Corp.), or Vertrel-XF (DuPont), in a ratio of about 0.001% to about 100% (wt/wt). In one aspect of the present invention, the lubricant is dissolved in an appropriate solvent in an amount of from about 0.01% to about 10%, e.g., about 0.1% to about 2%. A stamper comprising an imprinting surface and having at least one sub-micron feature thereon or therein is then submerged in the lubricant solution and then slowly withdrawn therefrom. In practicing the present invention, a conventional lifter-type dipper can be employed to submerge the stamper in the lubricant solution. Embodiments of the present invention enable formation of an effective lubricant coating that adheres to the stamper at a desirably low thickness of less than about 100 nm, such as about 1 nm to about 20 nm.

In another embodiment, a thin lubricating coating can be deposited on the imprinting surface of the stamper as by plasma deposition. For example, a nickel stamper made by electro-forming techniques was placed in a chamber of a reactive ion etching machine (Oxford Plasma Lab 80) where the deposition of a fluorocarbon film onto the nickel was carried out. The tool has an RF power of about 100 watts, a pressure of about 100 m/Torr and a $CHF_3$ flow rate of 4 sccm. An ESCA analysis was conducted of the lubricated stamper and compared to a stamper without such treatment (control). Table 1 shows the results of the elemental surface analysis of these two stampers. The presence of fluorine and an increased amount of carbon are observed for the treated stamper in comparison to the control stamper.

TABLE 1

Elemental composition, expressed in atom %, of the top 50 Å of the surface.

|  | C | O | Ni | F |
|---|---|---|---|---|
| Treated stamper | 40 | 0.5 |  | 59 |
| Control Stamper | 23 | 47 | 30 | — |

FIGS. 3(A)-3(B) show Atomic Force Microscopy (AFM) images and cross-sectional profiles of the Ni-based stamper and the replicated features of the stamped/imprinted PMMA layer, respectively. As is evident from both the AFM images and cross-sectional profiles, the features were substantially replicated without adverse peeling or otherwise detrimental distortion of the stamped PMMA surface.

Thus, the present invention advantageously provides processing techniques, instrumentalities, and methodologies, including the use of a stamper having a thin lubricating coating thereon. Surface modified stampers according to the present invention can perform high quality, fine-dimension patterning via thermal lithographic nano-imprinting which can be practiced at low cost and high product yield to provide, for example, substrates for magnetic recording media having integrally formed servo patterns.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail to avoid obscuring the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of fabricating a coating on a stamper that is suitable for sub-micron imprint lithography, the method comprising:

dipping a stamper suitable for thermal imprint lithography having an imprinting surface thereon and having sub-micron features in a solution containing a lubricant; and removing the stamper from the solution to apply a lubricant coating having a thickness of no more than about the smallest feature height on the stamper.

2. The method according to claim 1, comprising forming the coating to have a thickness of about 1 nm to about 100 nm.

3. The method according to claim 1, comprising forming the coating to have a thickness of about 1 nm to about 20 nm.

4. The method according to claim 1, comprising dip coating the stamper in a solution comprising a perfluoropolyether lubricant to provide the imprinting surface of the stamper with the lubricant coating.

5. The method according to claim 4, wherein the perfluoropolyether lubricant comprises Z-tetraol.

* * * * *